United States Patent
Weber et al.

(10) Patent No.: US 7,108,041 B2
(45) Date of Patent: Sep. 19, 2006

(54) HOLLOW NICKEL SHAPES BY VAPOR DEPOSITION

(75) Inventors: Reinhart Weber, Penetanguishene (CA); Konrad Benkovski, Perkinsfield (CA); Alan Horst, Midland (CA)

(73) Assignee: Weber Manufacturing Limited, Midland (CA)

( * ) Notice: Subject to any disclaimer, the term of this patent is extended or adjusted under 35 U.S.C. 154(b) by 172 days.

(21) Appl. No.: 10/799,240

(22) Filed: Mar. 12, 2004

(65) Prior Publication Data

US 2005/0028958 A1    Feb. 10, 2005

(30) Foreign Application Priority Data

Aug. 8, 2003    (CA)    ................................ 2437343

(51) Int. Cl.
*B22D 23/00*    (2006.01)

(52) U.S. Cl. .................................................. 164/46

(58) Field of Classification Search ................ 164/46, 164/131, 344
See application file for complete search history.

(56) References Cited

U.S. PATENT DOCUMENTS

| | | | |
|---|---|---|---|
| 3,768,948 A | 10/1973 | Horberg, Jr. et al. | 425/526 |
| 4,140,470 A | 2/1979 | Pasch et al. | 425/544 |
| 5,169,549 A | 12/1992 | Weber | 249/80 |
| 5,190,715 A | 3/1993 | Yamada et al. | 264/526 |
| 5,221,539 A | 6/1993 | Pallerberg et al. | 425/144 |
| 5,407,487 A | 4/1995 | Weber et al. | 118/728 |
| 5,470,651 A * | 11/1995 | Milinkovic et al. | 428/325 |
| 5,591,485 A | 1/1997 | Weber et al. | 427/250 |
| 5,750,160 A | 5/1998 | Weber et al. | 425/290 |
| 6,007,634 A * | 12/1999 | Weber et al. | 118/725 |
| 6,463,992 B1* | 10/2002 | Dowhan et al. | 164/46 |
| 6,843,646 B1* | 1/2005 | Ryan et al. | 425/195 |
| 2002/0100858 A1 | 8/2002 | Weber | 249/80 |
| 2003/0077351 A1 | 4/2003 | Ryan et al. | 425/526 |
| 2004/0241275 A1 | 12/2004 | Ryan et al. | |

FOREIGN PATENT DOCUMENTS

| | | |
|---|---|---|
| CA | 2045841 A1 | 12/1992 |
| CA | 2361348 A1 | 4/2003 |
| EP | 0 742 094 | 11/1996 |
| GB | 2240300 | 7/1991 |
| JP | 02108516 | 4/1990 |
| JP | 04351514 | 12/1992 |
| JP | 2001-047235 A2 | 2/2001 |
| WO | WO 03033268 A1 | 4/2003 |

\* cited by examiner

*Primary Examiner*—Kevin P. Kerns
(74) *Attorney, Agent, or Firm*—Butzel Long (57) ABSTRACT

A method and apparatus for producing a nickel shape or shell employs nickel vapor deposition onto the inside surface of a closed, multi-part mandrel. The closed multi-part mandrel eliminates the need for a separate deposition chamber and the nickel vapor deposition creates a nickel shell in the shape of the complete or multi-part partial mandrel internal surface resulting in a hollow or partially hollow nickel product.

13 Claims, 9 Drawing Sheets

HOLLOW NICKEL SHAPES BY VAPOR DEPOSITION

FIELD OF THE INVENTION

This invention relates to nickel vapor deposition to produce articles, such as tool components made of nickel.

BACKGROUND OF THE INVENTION

It is known to produce nickel components, such as shells or other shapes using nickel vapor deposition (NVD). Usually this involves the use of a deposition chamber, with a mandrel or deposition master being placed in the chamber. The mandrel is heated and nickel vapor in the form of nickel carbonyl gas is passed over the heated mandrel. As the nickel carbonyl gas contacts the hot mandrel surface, it decomposes to form a hard and dense nickel deposit on the mandrel. The deposited nickel forms a layer that accurately reproduces the surface details of the mandrel on which it is deposited.

U.S. Pat. No. 6,007,634 issued to Reinhart Weber et al, shows such a deposition chamber for producing nickel products.

A difficulty with the prior art NVD methods and apparatus employing deposition chambers, however, is that prior to the introduction of the nickel carbonyl vapor into the chamber, the total inner chamber has to be purged of any oxygen. This procedure takes in most cases, depending on chamber size, between 4 and 6 hours. A similar purging procedure has to be repeated after the deposition process is completed before the deposition chamber can be opened.

SUMMARY OF THE INVENTION

The present invention eliminates the use of a separate deposition chamber by using a multi-part mandrel that itself becomes the deposition chamber, greatly reducing the purging time required for a particular size of product being produced. The nickel vapor deposition produces a NVD nickel article where the external dimensions and surface definitions are an exact replication of the complete or partial mandrel internal surface.

According to one aspect of this invention, there is provided a method of producing a nickel article by nickel vapor deposition. A hollow multi-part mandrel is provided having interior wall portions defining at least a portion of the exterior surface of a nickel article to be produced. The hollow multi-part mandrel is purged of oxygen. The multi-part mandrel interior wall portions are heated to a temperature sufficient to deposit nickel thereon in the presence of nickel carbonyl vapor. Nickel carbonyl vapor is then passed through the heated hollow multi-part mandrel to produce the nickel article. The interior of the nickel article and the multi-part mandrel are then purged of nickel carbonyl vapor, and the nickel article is removed from the mold.

According to another aspect of the invention, there is provided an apparatus for producing nickel articles by nickel vapor deposition. A first mandrel member includes a wall having a first mandrel surface defining partially a nickel article to be produced. The first mandrel member also has a first parting line surrounding the first mandrel surface. A second mandrel member includes a wall having a second mandrel surface defining an additional portion of the article to be produced. The second mandrel member has a second parting line surrounding the second mandrel surface and is configured to mate with the first parting line to form an enclosure defining the article and permitting removal of the article upon opening of the mandrel members. Heating means are mounted in the mandrel members for heating the first and second mandrel surfaces to a predetermined temperature. At least one inlet diffuser and one outlet diffuser are mounted in the mandrel members for the passage of vapor through the enclosure.

BRIEF DESCRIPTION OF THE DRAWINGS

In order that the invention may be more clearly understood and more readily carried into effect, preferred embodiments of the invention will now be described, by way of example, with reference to the accompanying drawings in which.

DETAILED DESCRIPTION OF THE PREFERRED EMBODIMENTS

Referring to the drawings, reference numeral 10 denotes generally a preferred embodiment of a multi-part mandrel for use in producing a pair of nickel vapor deposition (NVD) articles or components called mold lifters 12, as seen in FIGS. 1 to 5. There are two lifters 12 in mandrel 10, being left and right hand lifters, although only one article or more than two, could be produced in mandrel 10, if desired.

Lifters 12 are typical mold components or tools used in the production of plastic injection, compression, reaction injection mold and spray tools. Mold lifters 12 are a component of these tools and in the prior art, they are usually manufactured from a solid block of material and fitted to molds to act as the moving part that aids in the ejection of the part. As produced by the present invention, however, lifters 12 are hollow nickel shells with reduced weight and excellent heat transfer characteristics, and as such they reduce overall manufacturing and assembly time, and costs. The NVD process herein described also allows a textured finish to be applied to lifters 12 in specific areas. Where multiple articles or tools are required, it is only necessary to etch the mandrel once, not each nickel lifter 12. The benefits are repeatability and lower cost.

Figure 3:
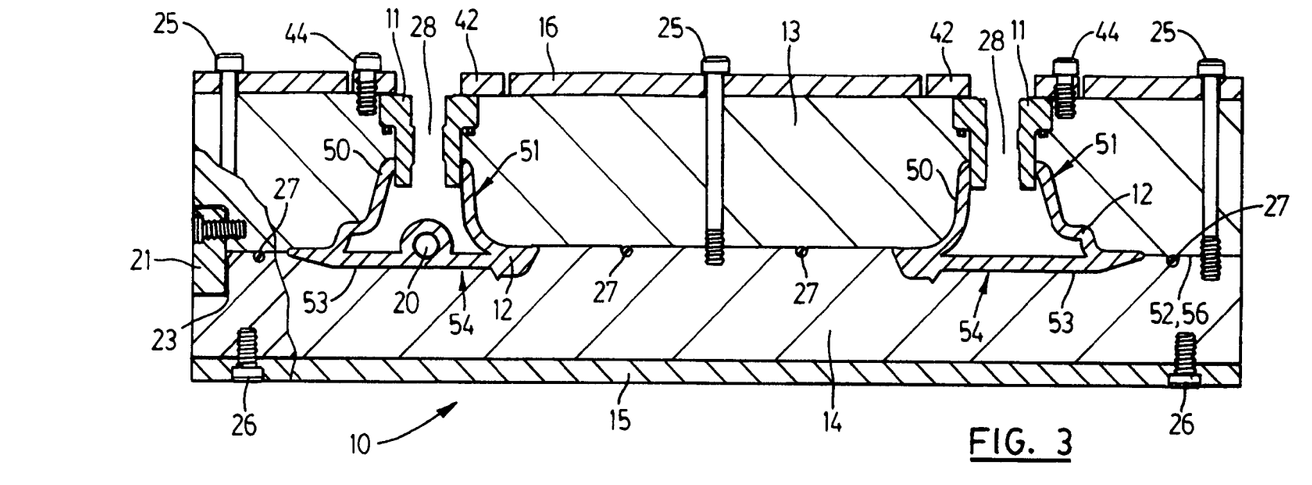
FIG. 3 is a cross-sectional view of the closed mandrel of FIG. 1 taken along lines 3—3 of FIG. 1 showing the nickel articles still in the mandrel.

Mandrel 10 includes a first or upper mandrel member 13 and a second or lower mandrel member 14. Mandrel members 13, 14 define the profile of the article, such as a lifter 12, to be produced in mandrel 10. First or upper mandrel member 13 has an interior wall portion defining two first concave depressions 50 therein (see FIG. 3) each of which defines the shape of an upper portion (as seen in FIG. 3) of lifters 12 (actually, these are lower portions of the lifters as the lifters are used themselves as tools or mandrels to produce the desired end product). These interior wall portions of upper mandrel member 13 are referred to as first partial female mold portions 51. Upper mandrel member 13 also has a first parting line or split line 52 (see FIG. 1) which surrounds the first concave depressions 50 or female mold portions 51.

The second or lower mandrel member 14 has an interior wall portion defining two second concave depressions 53 therein (see FIG. 3), each of which defines the shape of the lower portion (as seen in FIG. 3) of lifters 12 (again, the actual upper portions of lifters 12 as they are used as mandrels themselves in the production of an end product). These lower portions are referred to as second partial female mold portions 54. Lower mandrel member 14 also has a second parting line or split line 56 which surrounds the second concave depressions 53 of female mold portions 54.

Parting or split lines 52, 56 surround the respective first and second concave depressions 50, 53 and are configured to mate with each other to form an enclosure defined by the partial female mold portions 51, 54, and thus define the shape of lifters 12. The location of parting lines 52, 56 is dependent on the shape of the article to be made in mandrel 10 so as to allow the article to be removed after deposition. O-rings 27 installed between the two partial mandrel members 13, 14 in parting lines 52, 56 surround the lifters 12 and provide a good seal between mandrel members 13, 14. Bolts 25 and 26 are used to fasten the mandrel members 13, 14 together. Alignment tabs 21 fit into recesses 23 to provide accurate alignment between upper and lower mandrel members 13, 14.

Referring to FIGS. 1 to 4, inlet and outlet nozzles or diffusers 11 and 22, defining inlet and outlet ports 28, 29, are provided for the flow of nickel carbonyl gas through mandrel 10. Diffusers 11 and 22 are sometimes referred to as insulator bushings. Diffusers 11, 22 are formed out of an insulating material, such as nylon, on which nickel from the nickel carbonyl gas will not deposit. Diffusers 11, 22 are held in place by retainers 42 and retainer bolts 44.

In mandrel 10, there are four inlet nozzles or diffusers 11 and two outlet nozzles or diffusers 22. The number of inlet and outlet diffusers used in any particular mandrel will depend upon the shape or configuration of the part to be deposited with nickel, but in general, there should be twice as many inlet diffusers as outlet diffusers. In a multi-cavity mandrel, there could be 30 to 40 inlet and outlet diffusers. It is desirable to have the nickel carbonyl gas enter the mandrels gently, to allow uniform nickel deposition adjacent to the nozzles and avoid the velocity of the gas flow from hindering the deposition, as will be described further below.

Figure 1:
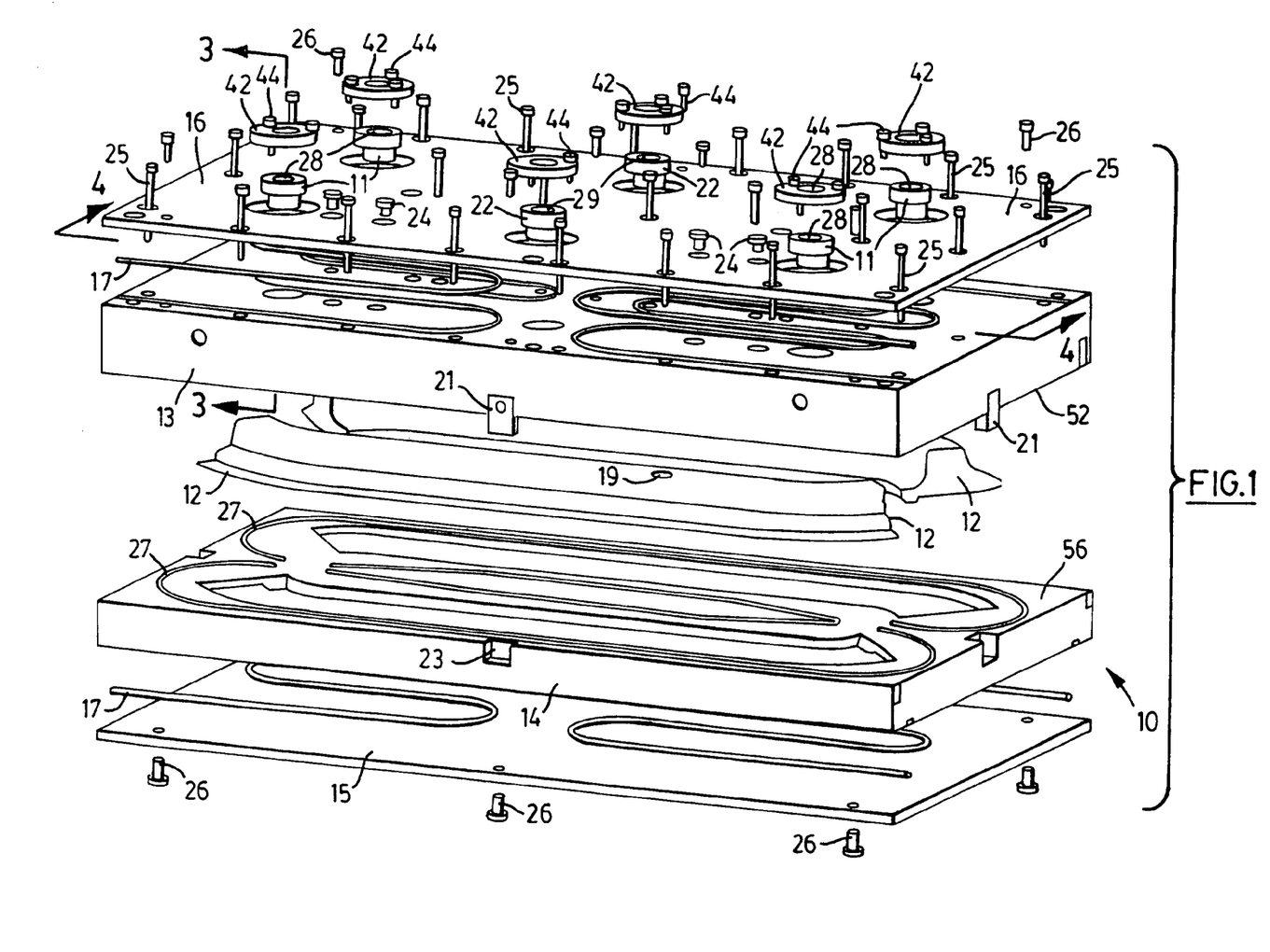
FIG. 1 is an exploded perspective view of a preferred embodiment of a multi-part mandrel according to the present invention showing nickel articles that have been formed in the multi-part mandrel located between upper and lower mandrel members.
Figure 2:
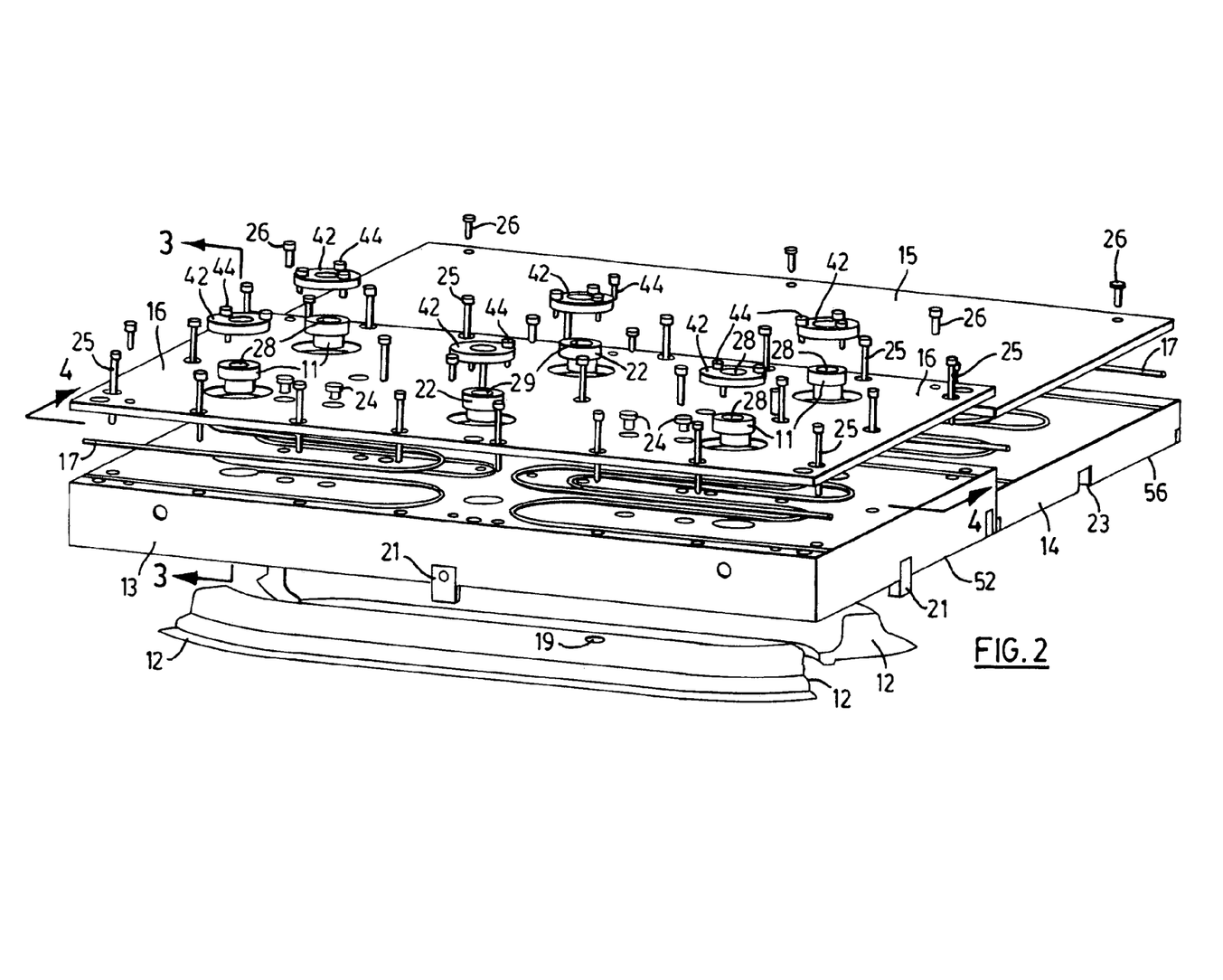
FIG. 2 is a perspective view of the multi-part mandrel of FIG. 1 showing the lower mandrel member having been rotated 180 degrees and located behind the upper mandrel member.
Figure 4:
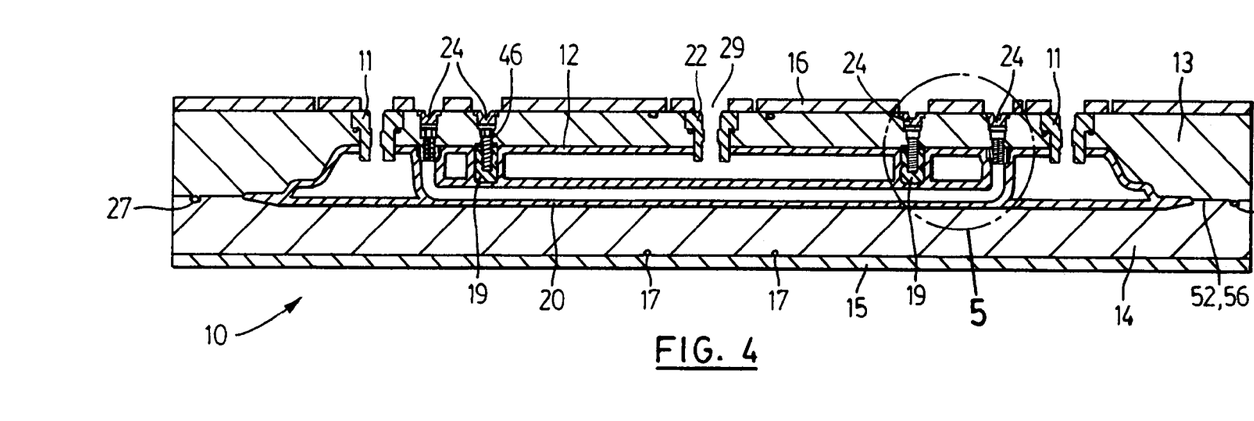
FIG. 4 is a cross-sectional view of the closed mandrel of FIG. 1 taken along lines 4—4 of FIG. 1 showing a nickel article still in the mandrel.
Figure 5:
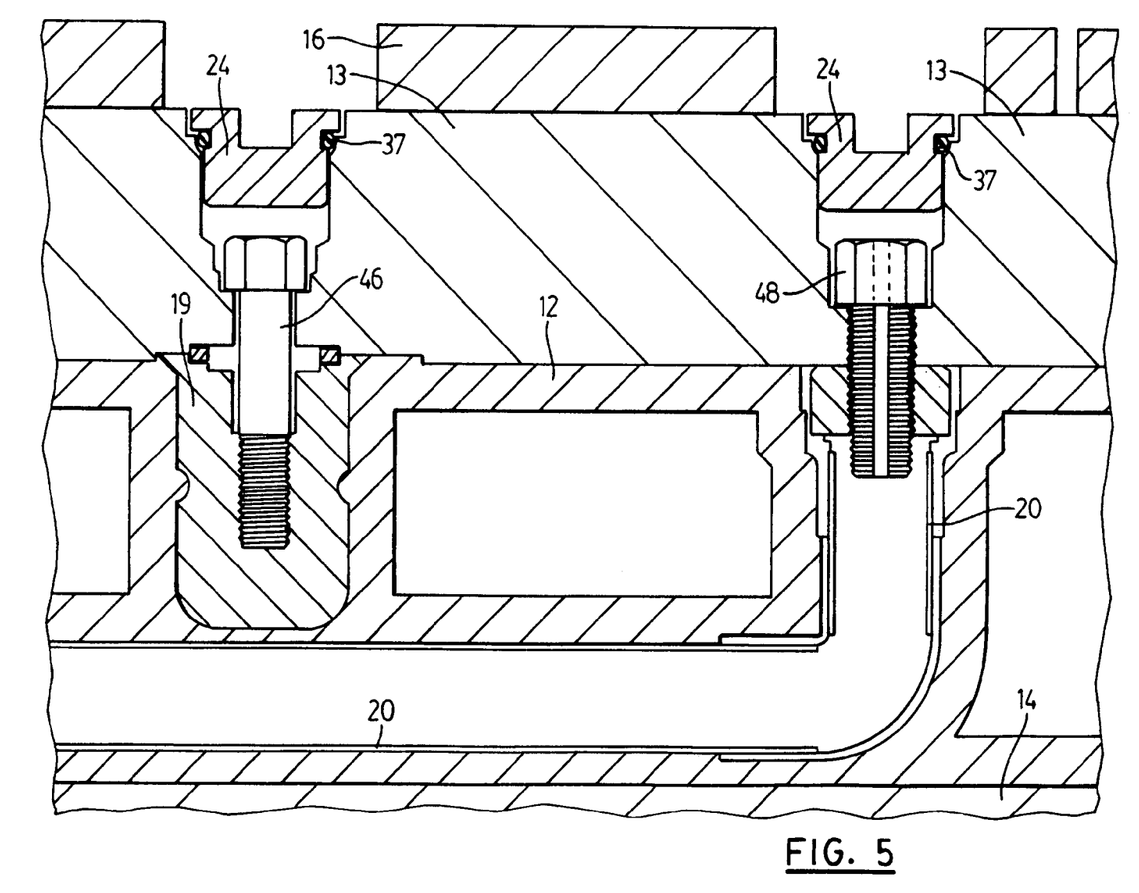
FIG. 5 is an enlarged cross-sectional view of the portion of FIG. 4 indicated by circle 5 showing a nickel article in the mandrel and how components to be encapsulated are held in place.

As seen best in FIGS. 1, 4 and 5, various additional components, such as threaded studs 19 and a hollow healing pipe 20 are optionally attached to the upper mandrel member 13 by bolts 46 and 48 to be encapsulated with nickel during the deposition process. Studs or encapsulations 19 are preferably made of steel and are used for the attachment of lifter or tie rods or other mounting devices to hold the NYD deposited articles in place during use. Encapsulations 19 are relcasably mounted on the partial female mandrel portions by bolts 46 and as such have female threaded openings adjacent to the partial female mandrel portions. However, encapsulations 19 could have male threaded projections that extend through the wall of the female mold portions and be held in place with nuts.

The encapsulated heating line or tube 20 forms a heat transfer circuit for the NVD end product, such as lifters 12. Bolts 48 are hollow to allow the interior of the tube 20 to be purged prior to the deposition process. Nitrogen and then carbon monoxide is used to purge tube 20. This is to prevent the carbonyl gas from becoming contaminated should air in tube 20 expand during the heating of mandrel 10. Threaded plugs 24 and O-rings 37 sealingly mount the end portions of tube 20 in mandrel 10 to prevent the escape of carbon monoxide from tube 20 and also seal against the escape of nickel carbonyl gas during the deposition process.

Figure 6:
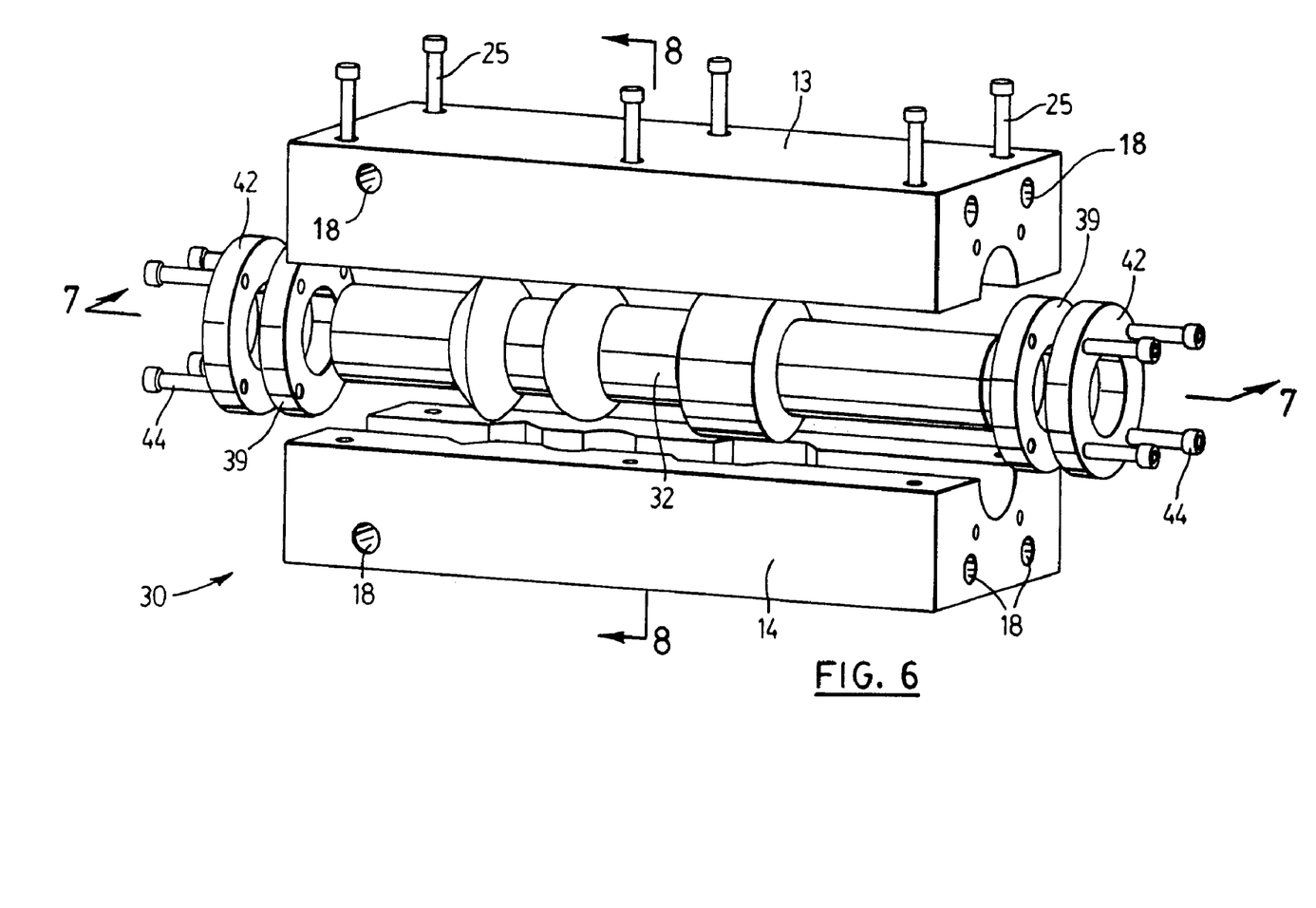
FIG. 6 is an exploded perspective view showing another preferred embodiment of the present invention used to make nickel components with open ends, and also showing a nickel article that has been formed in, and removed from the mandrel.
Figure 8:
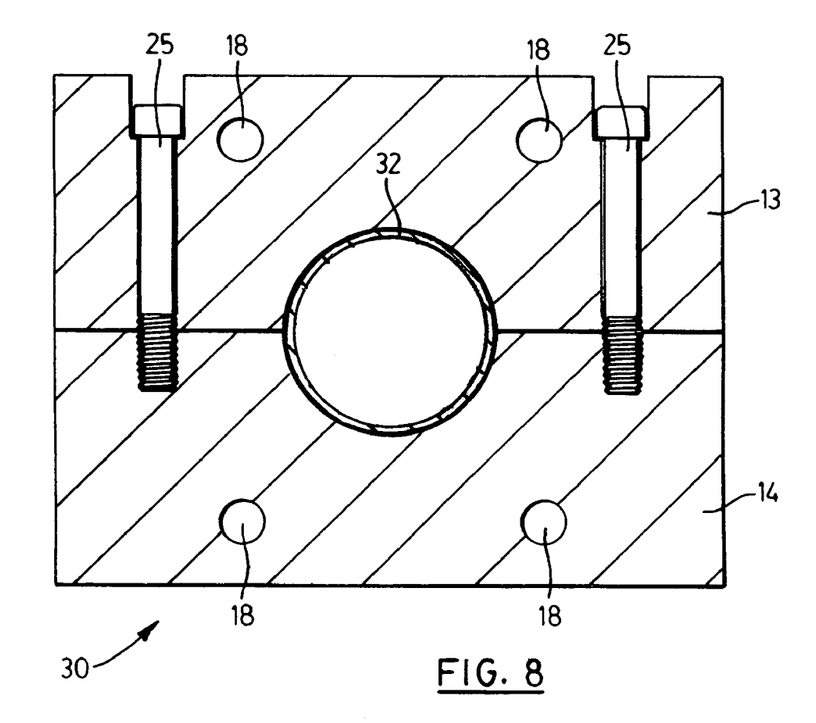
FIG. 8 is a cross-sectional view of the closed mandrel of FIG. 6 taken along lines 8—8 of FIG. 6 showing the nickel article still in the mandrel.
Figure 9:
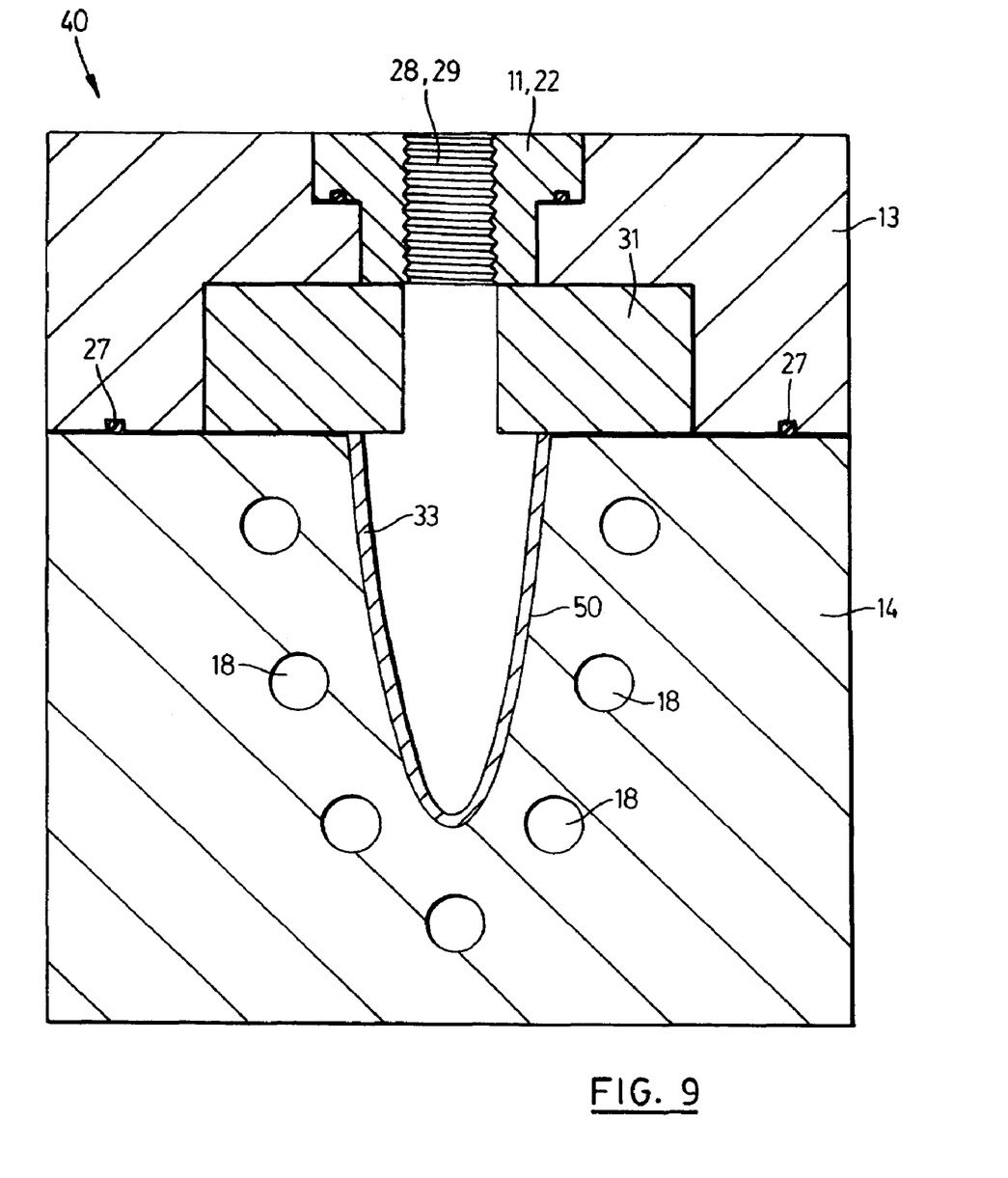
FIG. 9 is a cross-sectional view similar to FIG. 3 or 8, but showing yet another preferred embodiment of the present invention used to make a nickel article with a V-shaped cross-section still in the mandrel.

Electrical resistance heaters 17 may be embedded in mandrel members 13, 14 for heating mandrel 10 uniformly, or for providing distributed or varying temperature areas to affect the composition or thickness of the nickel deposited during the deposition process, as will be described further below. Alternatively, heated fluid may be forced through a series of drilled passages 18 as indicated in FIGS. 6, 8 and 9. Another alternative is to use a heating plate or plates (not shown) contacting the external areas of the mandrel members 13, 14. Insulation plates 15, 16 can also be installed on the outside surfaces of members 13, 14 to retain the heaters in place and for energy efficiency.

In FIGS. 1 to 5, the inlet and outlet nozzles 11, 22 are shown mounted in the upper mold member 13. However, they could be located anywhere in mandrel 10 to give good flow of nickel carbonyl gas through mandrel 10. Mandrel 10 is shown orientated horizontally, but it could be orientated vertically or any other orientation desired.

Figure 7:
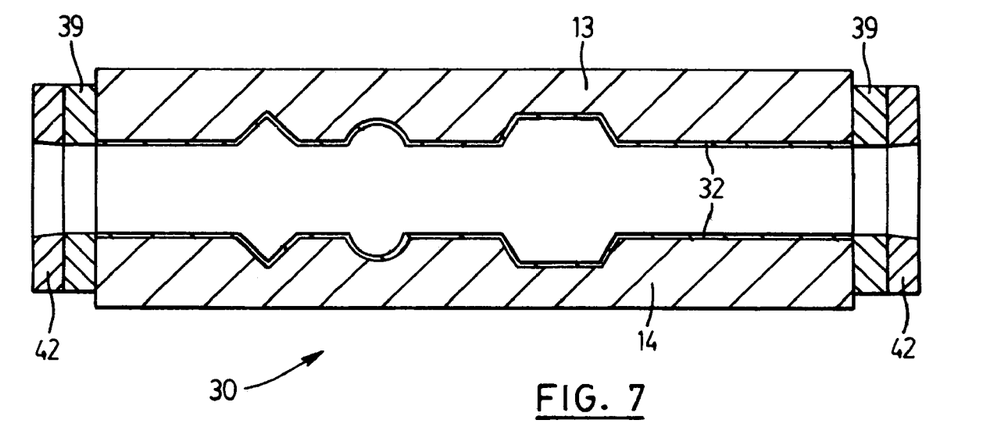
FIG. 7 is a cross-sectional view of the closed mandrel of FIG. 6 taken along lines 7—7 of FIG. 6 showing the nickel article still in the mandrel.

FIGS. 6 to 8 show another preferred embodiment of a mandrel 30 where various shapes or articles 32 of simple or complex geometry can be made through the present process. Parts or articles 32, simulating a pipe or tube, for example, open on both ends, can be produced. Insulation plates 39, formed of nylon or other material to which nickel will not adhere, are held in position by retainers 42 and bolts 44. Plates 39 and retainers 42 form an axial inlet and outlet for the passage of nickel carbonyl gas through mandrel 30.

Tubular article 32 can have any wall thickness desired, from a minimum of about 0.05 mm (0.002 inches) upward, until article 32 is almost solid. The configuration of article 32 is for purposes of illustration only, as it could have any shape or configuration desired.

FIG. 9 shows another preferred embodiment of a mandrel 40 where a lower mandrel member 14, together with a nylon insulation plate 31 on the inside surface of the upper mandrel 13, can produce open V-shaped parts 33, such as may be used for the leading edges of an airplane propeller or helicopter rotor blade. The surface temperature of the concave depression 50 can be controlled using heating passages 18 to regulate the thickness of the nickel deposited thereon. The wall thickness of the NVD nickel shapes 33 can be controlled and varied from a minimum of about 0.05 mm (0.002 inches) depending on the heating circuit layout for passages 18 and controls implemented in the various sections of the mandrel member 14. For example, at the leading edge or apex of an airfoil section for a propeller or rotor blade, hotter temperatures in the adjacent passages 18 could produce wall thicknesses of about 2.25 mm (0.090 inches), and at the outer or feather edges, cooler temperatures in the adjacent passages 18 could produce thicknesses in the area of 0.25 mm (0.01 inches). Also, the composition of nickel carbonyl gas can be varied during the deposition process to vary the hardness of the nickel over its thickness. The temperature and gas composition relationship to nickel hardness and wall thickness is described further below.

Figure 10:
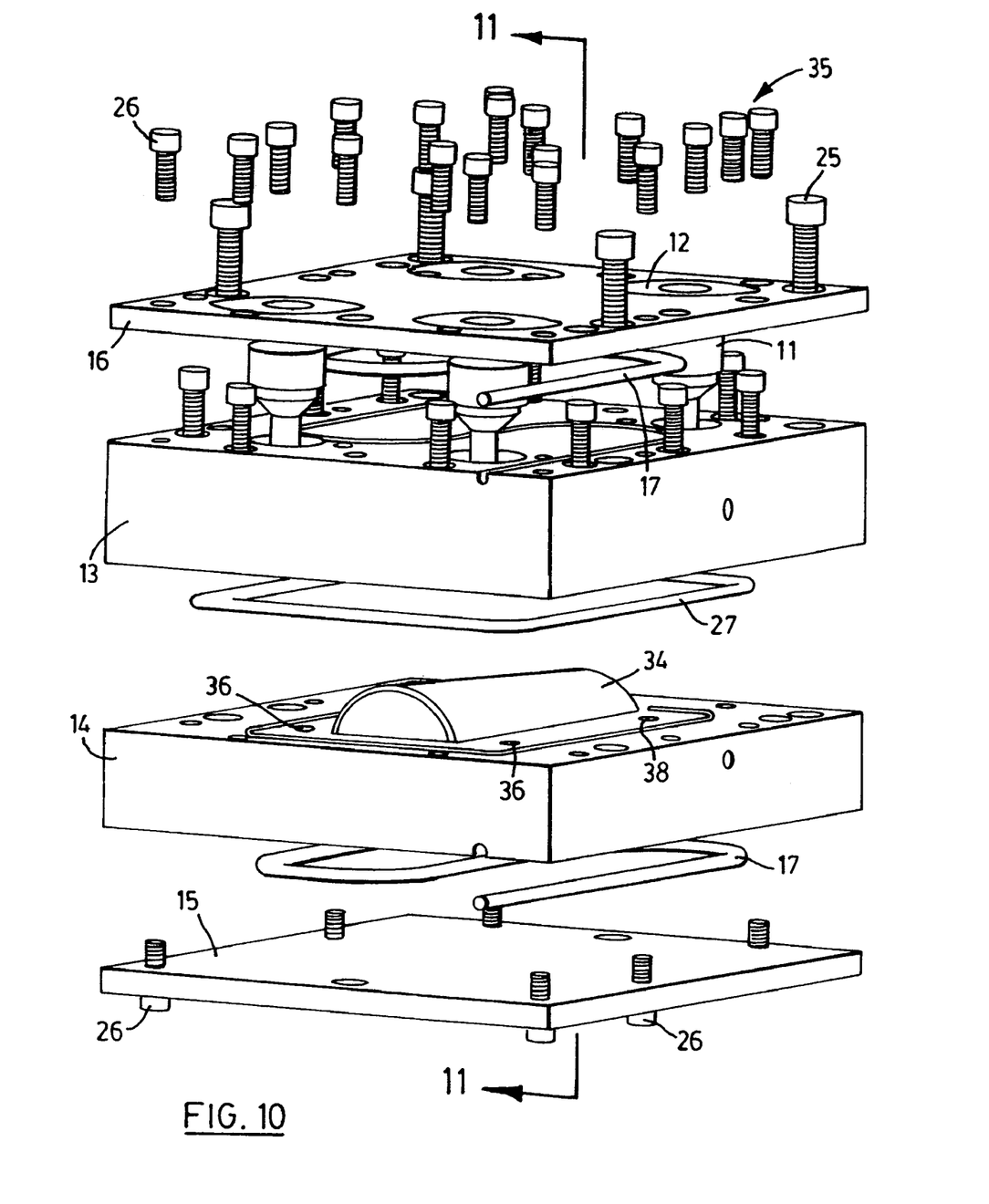
FIG. 10 is an exploded perspective view showing yet another preferred embodiment of the present invention used to make a hollow nickel article located in the lower mandrel member.
Figure 11:
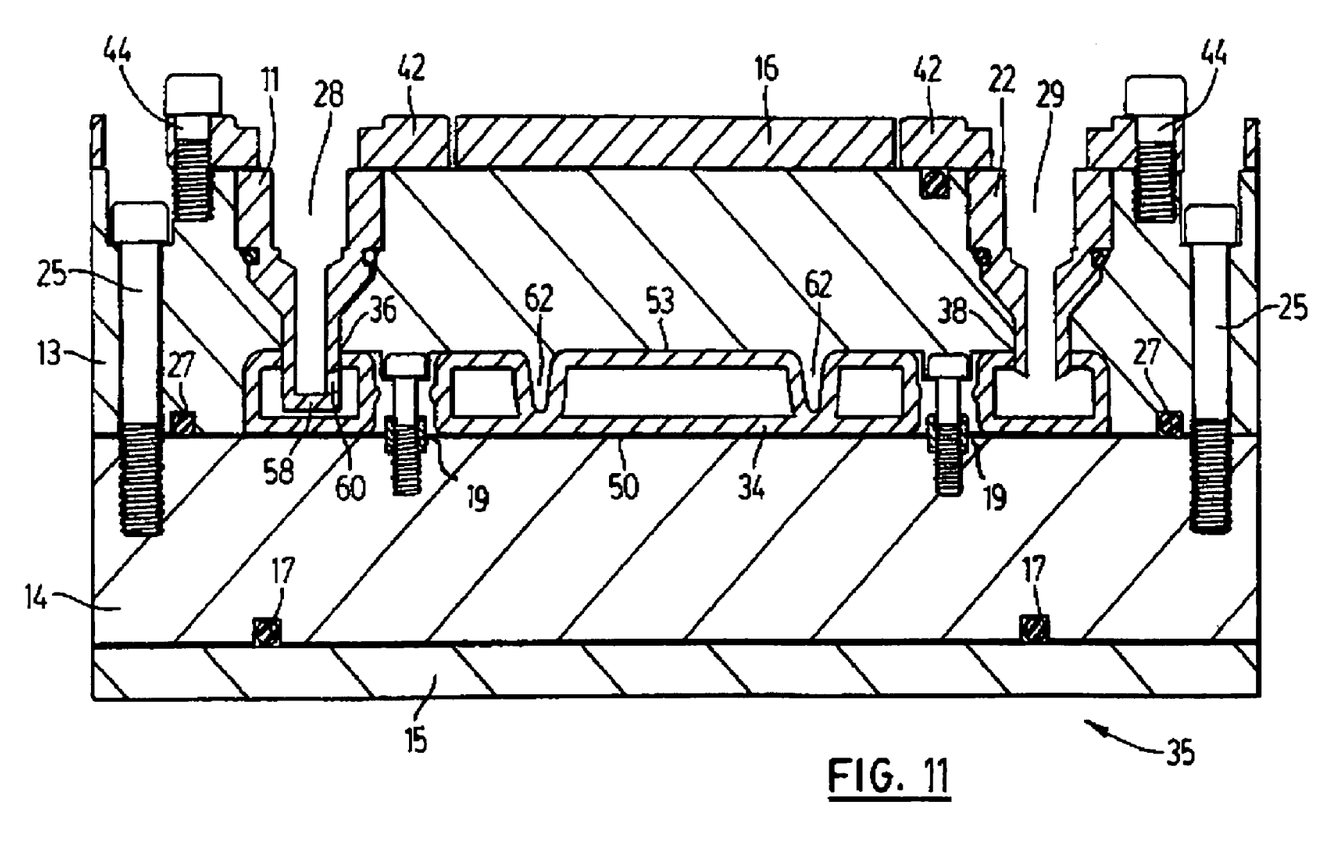
FIG. 11 is a cross-sectional view of the closed mandrel of FIG. 10 taken along lines 11—11 of FIG. 10 showing the nickel article still in the mandrel.

FIGS. 10 and 11 show another preferred embodiment of a mandrel 35, which is in the form of a hollow shell 34 that is produced for applications such as blow mold components where heating or cooling water can flow in and out of the shell 34 through the holes 36, 38 created by the inlet and outlet nozzles or diffusers 11, 22.

The number and location of inlet and outlet nozzles 11, 22 is dependent upon the geometry of the parts or articles 34 to be made in the mandrel members 13, 14. As mentioned above, the location of nozzles 11, 22 affects the uniformity of the wall thickness during the deposition process. It is desirable that the gas flow through nozzles 11, 22 does not interfere with the deposition of nickel during the deposition process. To assist in this regard, nozzles 11 can be formed with lower portions 58 that direct the gas flow sideways, or away from the partial female mold portions, or even upwardly at an angle, so that the gas flow is not directed right at the surfaces or walls of concave depressions 50, 53. This would affect the temperature of the wall surfaces and thus the nickel deposition rate, which could produce undesirable results. Lower portions 58 have outlet openings 60 that are typically about 4.7 mm (0.185 inches) in diameter. The nozzles could also enter the mandrels at an angle for a similar purpose. The nozzle inlet ports typically are in the range of about 4 to 6 mm and preferably about 5 mm (0.197 inches) in diameter. The outlet openings, of course, do not need to be circular. Inlet and outlet diffusers or nozzles 11, 22 are made from an insulating material, such as nylon, and are held in place by retainers 42 and retainer bolts 44.

As seen best in FIG. 11, one of the partial female mandrel members can have protrusions 62 that extend toward, but are spaced from, the adjacent female mandrel portion. This forms a gap that the nickel bridges during the deposition process to form wall supports for the finished nickel article.

The mandrels 10, 30, 35 and 40 can be made from a variety of metallic or non-metallic materials. Metals such as aluminum or steel may be used, and also certain epoxies, provided they do not off-gas so as to interfere with the nickel deposition. Different materials can also be used in the mandrel members 13 and 14 to produce different results in specific regions.

Any of these mandrels described above can also accommodate a silicone layer or covering in all or any part of the concave depression 50, 51 for the reproduction of particular surface contours, such as undercuts, or for producing a textured surface, such as imitation leather, on the surfaces of the finished products. The silicone must be replaced each time a product is produced in the mandrels.

In operation, the first and second mandrel members are assembled with the respective inlet and outlet diffusers or nozzles mounted therein. The nozzles are connected to a supply of inert gas and a vacuum source to purge the interior of the mandrel of oxygen. The mandrel members are then heated and the nickel carbonyl vapor or gas is passed through the mandrel to deposit nickel on the inside walls of the mandrel.

The nickel carbonyl vapor or gas (the terms "vapor" and "gas" are used interchangeably herein) can be diluted with carbon monoxide down to about 15 weight percent carbonyl, if desired. Lower concentrations of carbonyl produces harder nickel with a smaller crystalline structure than is the case with higher concentrations of carbonyl. The preferred composition is about 60–70 weight percent nickel carbonyl gas.

The nickel carbonyl vapor or gas composition typically flows through the mandrels at a pressure of about 20 to 40 kPa (3 to 6 psi), which results in a deposition rate of about 0.25 mm (0.01 inches) per hour with a mold wall temperature of about 165–175° C. and a gas composition of about 90 weight percent carbonyl. However, higher deposition rates can be achieved with higher carbonyl concentrations in the feed gas and higher temperatures of the mandrel. The deposition rate drops as the mandrel temperature drops, with minimal deposition taking place at a temperature around 145° C., and virtually no deposition taking place at temperatures around 130° C. This may be desirable in some areas of the mold. The preferred mandrel wall temperature preferably is 170° C. As mentioned above, different areas of the mold walls can be heated to different temperatures to obtain different wall thicknesses of the deposited nickel in some desired areas of the finished article.

As will be apparent to those skilled in the art in light of the foregoing disclosure, many alterations and modifications are possible in the practice of this invention without departing from the spirit or scope thereof. Accordingly, the scope of the invention is to be construed in accordance with the substance defined by the following claims.

The invention claimed is:

1. A method of producing a nickel article by nickel vapor deposition, comprising the steps of: providing a hollow multi-part mandrel having interior wall portions defining at least a portion of the exterior surface of a nickel article to be produced; purging the hollow multi-part mandrel of oxygen; heating said multi-part mandrel interior wall portions to a temperature sufficient to deposit nickel thereon in the presence of nickel carbonyl vapor; passing nickel carbonyl vapor through the heated hollow multi-part mandrel to produce said nickel article; purging the interior of the nickel article and the multi-part mandrel of nickel carbonyl vapor; and removing the nickel article from the mandrel.

2. A method as claimed in claim 1 wherein the multi-part mandrel interior wall portions are heated to at least 165° C. in areas where it is desired to deposit nickel.

3. A method as claimed in claim 1 wherein the multi-part mandrel interior wall portions are not heated above 130° C. in areas where nickel is not desired to be deposited.

4. A method as claimed in claim 1 wherein portions of the multi-part mandrel interior wall portions are heated to different temperatures to obtain different wall thicknesses of deposited nickel in different areas of the nickel article.

5. A method as claimed in claim 1 and further comprising the step of mounting an additional component on the interior wall portions to be encapsulated in nickel during the deposition process.

6. A method as claimed in claim 1 wherein the nickel carbonyl gas is passed through the heated hollow multipart mandrel until the deposited nickel is at least 0.05 mm (0.002 inches) in thickness.

7. A method as claimed in claim 1 wherein the nickel carbonyl vapor is mixed with carbon monoxide to vary the hardness of the nickel deposited.

8. A method as claimed in claim 1 wherein the nickel carbonyl vapor is mixed with carbon monoxide to vary the deposition rate of the nickel deposited.

9. A method as claimed in claim 7 wherein the amount of carbon monoxide mixed with the nickel carbonyl vapor is varied during the deposition process.

10. A method as claimed in claim 1 wherein the temperature of the multi-part mandrel interior wall portions is set to produce a nickel deposition rate of about 025 mm (0.01 inches) per hour.

11. A method as claimed in claim 1 wherein the temperature of the multi-part mandrel interior wall portions is varied during the deposition process to vary the rate of deposition of nickel.

12. A method as claimed in claim 2 wherein portions of the multi-part mandrel interior wall portions are heated to different temperatures to obtain different wall thicknesses of deposited nickel in different areas of the nickel article.

13. A method as claimed in claim 8 wherein the amount of carbon monoxide mixed with the nickel carbonyl vapor is varied during the deposition process.

* * * * *

UNITED STATES PATENT AND TRADEMARK OFFICE
CERTIFICATE OF CORRECTION

PATENT NO.         : 7,108,041 B2
APPLICATION NO. : 10/799240
DATED                  : September 19, 2006
INVENTOR(S)        : Reinhart Weber et al.

It is certified that error appears in the above-identified patent and that said Letters Patent is hereby corrected as shown below:

Col. 4, line 8, change "healing" to --heating--
Col. 8, line 1, change "025" to --0.25--

Signed and Sealed this

Tenth Day of April, 2007

JON W. DUDAS
*Director of the United States Patent and Trademark Office*